(12) United States Patent
Taoka et al.

(10) Patent No.: US 7,266,019 B2
(45) Date of Patent: Sep. 4, 2007

(54) NON-VOLATILE MEMORY DEVICE AND ERASING METHOD THEREFOR

(75) Inventors: Hideho Taoka, Komaki (JP); Yoshihiro Suzumura, Tajimi (JP); Kanji Hirano, Mino (JP); Satoru Kawamoto, Owariasahi (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/215,889

(22) Filed: Aug. 30, 2005

(65) Prior Publication Data
US 2006/0044919 A1 Mar. 2, 2006

Related U.S. Application Data

(63) Continuation of application No. PCT/JP2004/012486, filed on Aug. 30, 2004.

(51) Int. Cl.
*G11C 11/34* (2006.01)
*G11C 16/04* (2006.01)
(52) U.S. Cl. ............... 365/185.29; 365/185.3
(58) Field of Classification Search .......... 365/185.29, 365/185.3, 185.2
See application file for complete search history.

(56) References Cited

U.S. PATENT DOCUMENTS

| | | | | |
|---|---|---|---|---|
| 5,657,268 A * | 8/1997 | Truong et al. | ......... | 365/185.13 |
| 5,712,815 A * | 1/1998 | Bill et al. | ......... | 365/185.03 |
| 5,912,845 A * | 6/1999 | Chen et al. | ......... | 365/185.3 |
| 6,046,932 A | 4/2000 | Bill et al. | | |
| 6,172,909 B1 | 1/2001 | Haddad et al. | | |
| 6,205,074 B1 * | 3/2001 | Van Buskirk et al. | ......... | 365/211 |
| 6,252,803 B1 * | 6/2001 | Fastow et al. | ......... | 365/185.22 |
| 6,400,608 B1 * | 6/2002 | Fastow et al. | ......... | 365/185.22 |
| 6,735,114 B1 * | 5/2004 | Hamilton et al. | ......... | 365/185.03 |
| 6,842,378 B2 * | 1/2005 | Chang | ......... | 365/185.22 |
| 6,967,873 B2 * | 11/2005 | Hamilton et al. | ......... | 365/185.3 |
| 6,987,696 B1 * | 1/2006 | Wang et al. | ......... | 365/185.29 |
| 2001/0040836 A1 | 11/2001 | Mori et al. | | |
| 2003/0021155 A1 * | 1/2003 | Yachareni et al. | ..... | 365/185.22 |

FOREIGN PATENT DOCUMENTS

| | | |
|---|---|---|
| JP | 2000-260189 | 9/2000 |
| JP | 2001-067882 | 3/2001 |
| JP | 2001-184868 | 7/2001 |
| JP | 2001-250390 | 9/2001 |
| JP | 2002-025280 | 1/2002 |

* cited by examiner

*Primary Examiner*—Van Thu Nguyen
*Assistant Examiner*—Allison P Bernstein
(74) *Attorney, Agent, or Firm*—Ingrassia Fisher & Lorenz, P.C.

(57) ABSTRACT

During an erasing sequence, after a preprogram operation (S1), an erasing operation (S3), and an APDE operation (S5) are executed and confirmation by an APDE verify operation (S6: P) and confirmation by an erase-verify operation (S7: P) are completed, step A is executed prior to a soft-program operation (S10) of a plurality of memory cells. A dummy memory cell program operation (S8) is continuously executed until a completion of a program operation is confirmed by a dummy memory cell program verify operation (S9). By execution of the program operation on the dummy memory cells, a voltage stress similar to that of a program operation is applied to memory cells in an over-erased state via bit lines. Thereby, the over-erased state is reduced thereby lowering a column leak current. Erroneous recognition during a soft-program verify operation (S11) can be prevented, and excessive soft-programming can be avoided.

18 Claims, 15 Drawing Sheets

FIG. 4
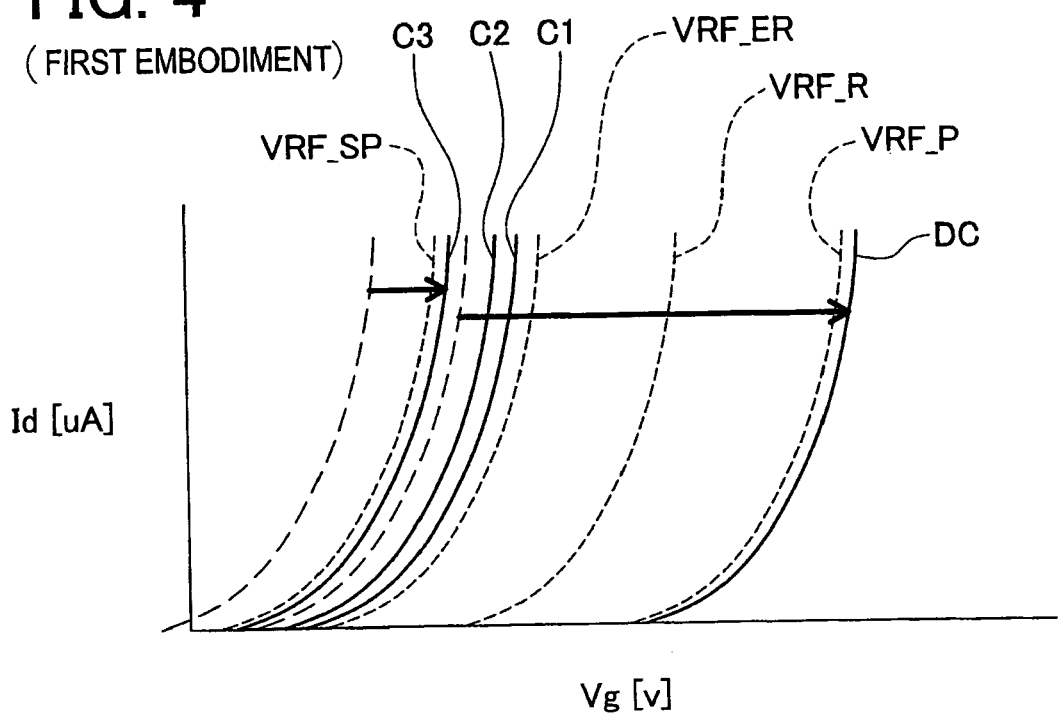
(FIRST EMBODIMENT)
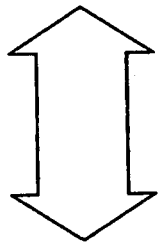
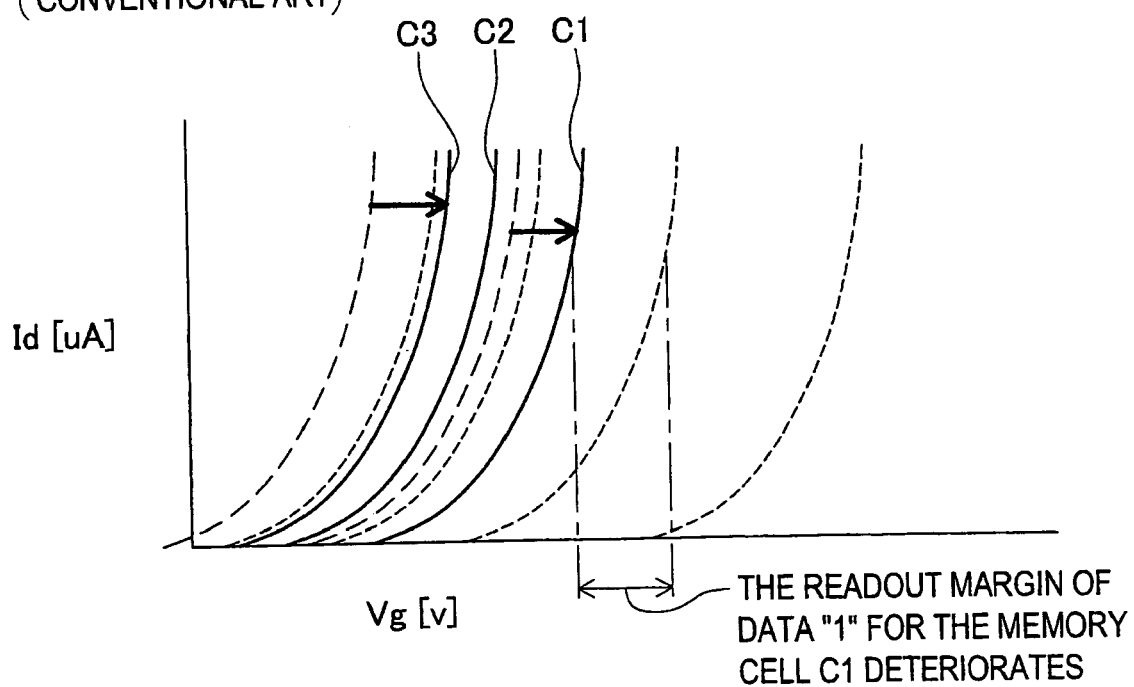
(CONVENTIONAL ART)
THE READOUT MARGIN OF DATA "1" FOR THE MEMORY CELL C1 DETERIORATES

NON-VOLATILE MEMORY DEVICE AND ERASING METHOD THEREFOR

CROSS-REFERENCES TO RELATED APPLICATIONS

This is a continuation of International Application No. PCT/JP2004/012486, filed Aug. 30, 2004 which was not published in English under PCT Article 21(2).

TECHNICAL FIELD

The present invention relates to non-volatile memory devices, and more particularly to erasing memory cell data in a non-volatile memory device.

BACKGROUND

Background Art

In an erasing method for a non-volatile memory device disclosed in FIG. 1 of Japanese unexamined patent publication No. 2002-25280, when an erasing operation starts, first, a writing operation by writing before erasing (preprogramming) is executed to all memory cells in a block, whereby threshold voltages of the memory cells are all set to high threshold voltages. Subsequently, for each word line, an erase pulse to erase information is applied (S1) to memory cells connected to that word line, and a first verify operation (S2) to confirm whether or not the information has been erased, a second verify operation (S3) to confirm whether or not over-erasing has occurred, and, when an over-erased memory cell has been found, a soft-program operation (S4) to that memory cell are executed. And, to all word lines, the routine from steps S1 to S4 are repeated.

Since the application of an erase pulse, second verify operation, and soft-program operation are executed to each of the word lines, an over-erased memory cell is uniquely specified per bit line and the soft-program operation can be executed to only the over-erased memory cell.

When applying an erase pulse to all memory cells in a block in accordance with the '280 publication, however, has problems in regards to memory cells to be over-erased because of the variation in characteristics of each of the memory cells and the like. Specifically, disclosed in FIG. 15 of the '280 publication is a soft-program-separated erasing method wherein soft-programming is executed after executing an erasing operation to all word lines. Since a memory cell having a negative threshold voltage as a result of over-erasing is present on an identical bit line, if a soft-program verify operation is executed to a memory cell having a normal threshold value different from this memory cell having a negative threshold voltage, a current which flows to the over-erased memory cell is added on the bit line so that the threshold voltage of the target memory cell is erroneously judged by a differential amplifier in some cases.

Problems to be Solved by the Invention

However, in the solution of the '280 publication as described above, the erasing pulse application, erase verify operation as to whether or not over-erasing has occurred, soft-program operation when over-erasing has been detected, and soft-program verify operation for detecting a completion thereof are executed in order for each of the word lines. Therefore, a drawback of the prior art is that this sequence is to be repeated for each of the word lines arranged in a block in large numbers, which takes a great deal of time until a completion of the erasing sequence. With the heightened integration of non-volatile memory devices, an increase in the number of word lines arranged in a block is expected. Therefore, in the future, it may take an increasingly long time until a completion of the erasing sequence in accordance with the prior art.

SUMMARY OF THE INVENTION

Means for Solving the Problems

The present invention has been made to solve at least one of the problems in the background art as described above, and an object thereof is to provide an erasing method for a non-volatile memory device which is capable of executing, in a non-volatile memory device, a favorable soft-program operation in a short time without causing a deterioration in a readout margin of data "1" to over-erased memory cells, and to provide a non-volatile memory device with such erasing method.

To achieve the object stated above, there is provided a data erase method for a non-volatile memory device to which plural electrically rewritable memory cells are connected through a predetermined number of data input/output terminals. The data erase method comprises the steps of executing an erase operation to the plural memory cells, and applying bias voltage according to a program operation to the data input/output terminals without executing a program operation to a specific memory cell successively after the erase operation.

In the erasing method for a non-volatile memory device in accordance with the present invention, when executing programming by application of a bias voltage due to a program operation to data input/output terminals of over-erased memory cells after executing an erasing operation by application of an electrical bias voltage to a predetermined number of memory cells connected in common through data input/output terminals, while no programming operation is successively executed to a specific memory cell.

Another object of the present invention is providing a non-volatile memory device to which plural electrically rewritable memory cells are connected in common through a predetermined number of data input/output terminals, the non-volatile memory device comprising dummy memory cells connected in common through the data input/output terminals, wherein, in data erase processing of the plural memory cells, a program operation is executed on the dummy memory cells after an erase operation on the plural memory cells.

In the non-volatile memory device of the present invention, by execution of a program operation to dummy memory cells connected in common through data input/output terminals after executing an erasing operation by application of an electrical bias voltage to a predetermined number of cells connected in common through the data input/output terminals, a bias voltage due to the program operation is applied to the data input/output terminals of over-erased memory cells, thus programming is executed.

Effects of the Invention

According to an erasing method for a non-volatile memory device in accordance with the present invention, after an erasing operation is executed in bulk to a plurality of memory cells including a predetermined number of memory cells connected in common to data input/output terminals, while avoiding harmful effects of memory cells in an over-erased state, a program operation to recover threshold values of the over-erased memory cells can be executed.

When memory cells in a normal erased state and memory cells in an over-erased state are connected in common to data input/output terminals, in a verify operation after erasing to the memory cells in a normal erased state, there is a case where a current which flows to the memory cells in an over-erased state is added and the memory cells in a normal state are erroneously judged to be memory cells in an over-erased state. However, even in this case, since no program operation is successively executed to identical memory cells, programming is never excessively executed to the memory cells in a normally erased state by a program operation based on the erroneous judgement. A situation wherein memory cells in a normal state are brought into an excessively programmed state or a situation wherein completion of a program operation cannot be detected since a large number of memory cells are connected to an identical bit line can be avoided.

In addition, since an unnecessary program operation can be avoided, disturbance phenomenon to other memory cells can be minimized. Specifically, variation in threshold voltage of memory cells such as a rise in threshold voltage due to a gate-disturb phenomenon and a decline in threshold voltage due to a drain-disturb phenomenon can be suppressed.

In addition, in the absence of an unnecessary program operation and an unnecessary program verify operation, a reduction in time of an erasing sequence can be realized, and also a reduction in current consumption in the erasing sequence can be realized.

In addition, unlike the '280 publication wherein application of an erasing pulse is executed to each of the word lines in order, a deleting operation, which is a precondition to avoiding the above-described situations, can be executed to a plurality of memory cells in bulk. In comparison to the '280 publication, an erasing sequence can be completed in a much shorter time.

Prior to executing a soft-program operation to memory cells, by executing a program operation to dummy memory cells, a drain-disturb phenomenon is induced in memory cells in an over-erased state connected in common via data input/output terminals. Thereby, a pseudo-program operation can be executed to the memory cells in an over-erased state to relieve or eliminate the over-erased state.

Herein, the disturbance phenomenon means a phenomenon wherein, as a result of overlapping of a floating gate condition with bias application to a gate or drain, a voltage stress similar to that of an erasing operation or program operation is applied to the memory cell. In a memory cell in a programmed state, gate voltage is low (high in the threshold value) with an electric charge accumulated in the floating gate, and by a low-voltage gate bias and/or a high-voltage drain bias, a stress similar to that during an erasing operation is applied. In a memory cell in an erased state, gate voltage is high (low in the threshold value) without electric charge in the floating gate, and by a high-voltage gate bias and/or a low-voltage drain bias, a stress similar to that of a program operation is applied.

According to the present invention, an erasing method for a non-volatile memory device which is capable of executing a favorable soft-program operation in a short time to memory cell(s) in an over-erased state without causing a deterioration in a readout margin of data "1" (an erased memory cell, namely, a memory cell with a low threshold value) for memory cells in a non-over-erased state can be provided.

BRIEF DESCRIPTION OF DRAWINGS

FIG. 4 is a diagram showing Id-Vg characteristics of memory cells when an erasing sequence has been completed in accordance with the first embodiment of the present invention;

DETAILED DESCRIPTION OF THE INVENTION

Hereinafter, embodiments of an erasing method for a non-volatile memory device and a non-volatile memory device will be described in detail while referring to FIGS. 1 through 15.

Figure 1:
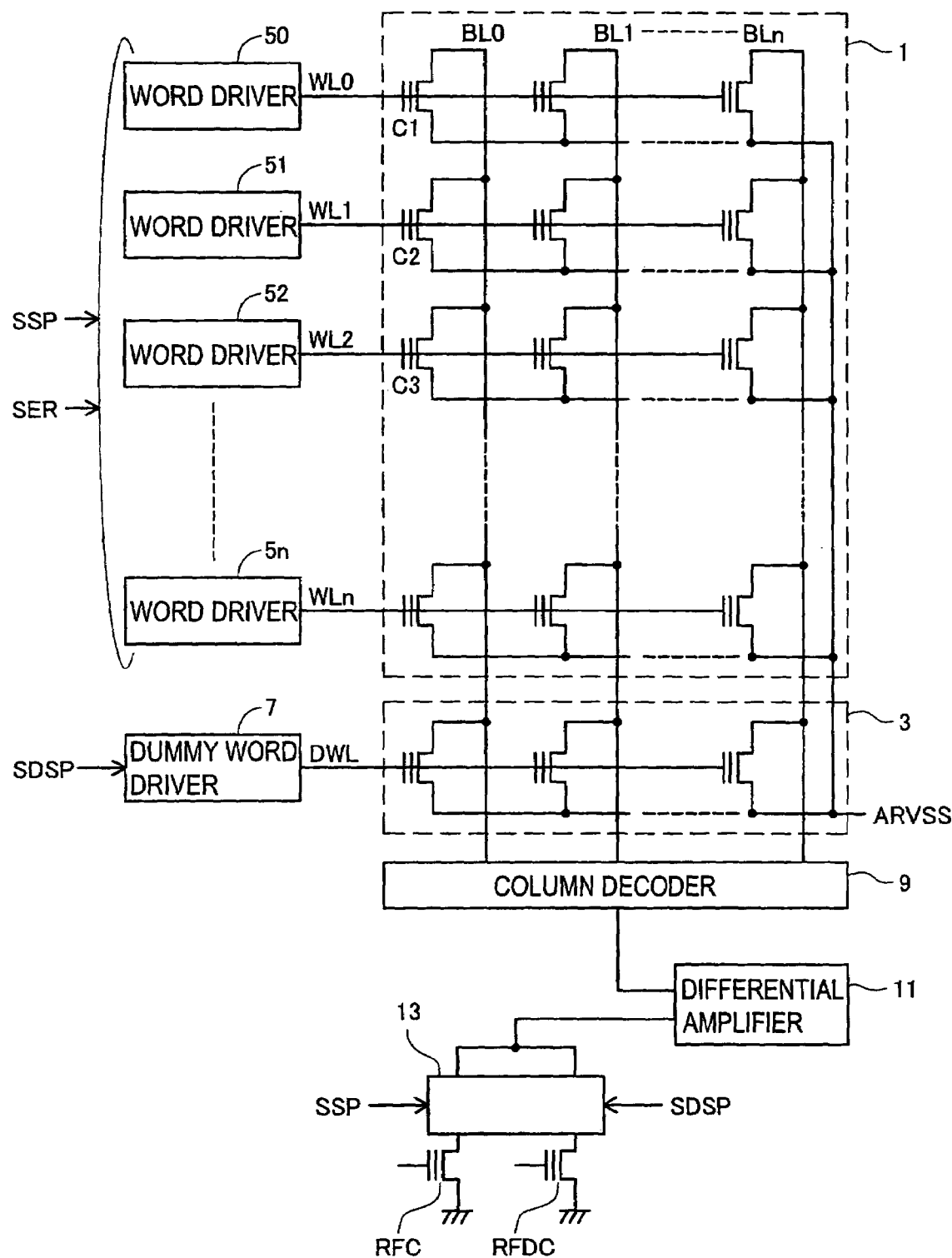
FIG. 1 is a circuit block diagram for executing an erasing sequence in accordance with a first embodiment of the present invention.

In a circuit block diagram in accordance with a first embodiment of the present invention shown in FIG. 1, a memory cell array 1 is constructed by memory cells arranged at respective intersecting positions between word lines WL0 through WLn selected by respective word drivers 50 through 5n and bit lines BL0 through BLn selected by a column decoder 9. For the respective memory cells, respective gate terminals are connected per line in common to one word line, and respective drain terminals are connected per column in common to one bit line.

Furthermore, dummy memory cells whose drain terminals are connected to bit lines and whose gate terminals are connected in common to a dummy word line DWL controlled by a dummy word driver 7 are provided, thereby forming a dummy memory cell array 3.

In addition, for all memory cells and all dummy memory cells, source terminals are connected in common to a reference voltage ARVSS. In addition, the dummy memory cells cannot be accessed according to external addresses since no external addresses have been allocated thereto. The dummy memory cells do not become an erasing target in an erasing sequence and, therefore, do not become program-target memory cells in a program operation after an erasing operation of the erasing sequence. In a program operation after an erasing operation, the program operation is executed while employing externally-accessible normal memory cells as focused memory cells, whereas in a program operation executed for the purpose of recovering a threshold voltage, the dummy memory cells are not selected and remain non-focused memory cells.

Data which is read out of a bit line selected by the column decoder 9 is inputted into a differential amplifier 11, and a comparing operation is executed with either of reference cells RFC and RFDC selected via a reference cell selecting section 13. In the reference cell selecting section 13, based on program control signals SSP and SDSP controlled by an control section (not shown), the reference cell RFC is selected to confirm a program state for memory cells arranged in the memory cell array 1, and the dummy reference cell RFDC is selected to confirm a program state for dummy memory cells arranged in the dummy memory cell array 3. Thus, threshold voltages of the reference cells RFC and RFDC can be adjusted according to individual program operations different from the aforementioned program operation.

By this comparing operation, whether or not a memory cell in an over-erased state is present is confirmed, and also, if a memory cell in an over-erased state is present, a soft-program operation or program operation is executed, and a program state is confirmed for each of the memory cells connected to the bit line.

Thus, during programming, such as programming by a hot-electron injection method into a memory cell, a high-voltage is given to a control gate (word line or dummy word line) and a drain of the memory cell, and a low voltage is given to a source thereof. During soft-programming, voltage of the control gate is made into a high voltage slightly lower than the program voltage, a high voltage is given to the drain, and a low voltage is given to the source. Namely, a memory cell during soft-programming is slightly lower in voltage between the terminals than the memory cell during programming, and the electron injection rate of hot electrons into a floating gate is, consequently, lower. Therefore, soft-programming may be required to raise the voltage of the control gate into a high voltage equal to the program voltage, making the voltage of the drain into a high voltage slightly lower than the program voltage, and giving a low voltage to the source.

In addition, in accordance with the present invention, including the first embodiment of the present invention, when a memory cell in an over-erased state is present, a method for recovering the same to a memory cell having a normal threshold value by a soft-program operation will be described. However, without limitation to a soft-program operation, the present invention may employ a method for recovering any memory cell to a memory cell having a normal threshold value by the above-described program operation. In this case, a memory cell in an over-erased state is once programmed, and only the re-programmed memory cell is erased.

Since a plurality of memory cells are connected per bit line to the bit lines BL0 through BLn when the memory cells contain a memory cell in an over-erased state, memory cells except for the memory cell in an over-erased state are also erroneously recognized as being in an over-erased state. This is because a current is always leaking to the bit line via the memory cell in an over-erased state (a so-called column leak current is flowing) and confirmation of an erased state is carried out by the differential amplifier with this column leak current added.

Furthermore, when a program operation or soft-program operation is executed based on the erroneous recognition without a program operation or soft-program operation to non-selected over-erased memory cells, a program operation or soft-program operation is continued for the erroneously recognized memory cells having a normal threshold value. This is because, when a memory cell in an over-erased state is present among memory cells connected to a bit line selected by the column decoder 9 and a sum total of current which flows on the bit line is greater than a current which flows to the reference cell RFC, a program operation or soft-program operation is executed to a specific memory cell having a normal threshold value, for which this is intrinsically unnecessary, while the problem arising from memory cells in the over-erased state has not yet been eliminated.

In accordance with the first embodiment, prior to executing a soft-program operation in units of sectors where a memory cell in an over-erased state is present based on a program control signal SSP, by applying a positive voltage to the word lines WL0 through WLn, a soft-program operation or program operation to dummy memory cells is executed based on a program control signal SDSP by applying a positive voltage to the dummy word line DWL. As a result of a program operation or the like to the dummy memory cells, a similar program operation can be executed to memory cells in an over-erased state connected to an identical bit line based on a drain-disturb phenomenon.

By previously executing a program operation or the like to dummy memory cells after an erasing operation, for a memory cell in an over-erased state out of a plurality of memory cells connected to an identical bit line, a recovery from the over-erased state or a reduction in the over-erased state can be realized. When a bulk erasing sequence is executed to a sector or a sector group as one unit, a recovery from an over-erased state after an erasing operation can also be realized. A subsequent soft-program operation can then be effectively carried out, whereby an unnecessary bias application can be avoided. Reduction in time of an erasing sequence can be realized, and also erased states of respective memory cells as a result of an erasing sequence can be made uniform.

Thus, during programming, by a program control signal SSP or SDSP outputted from a control section (not shown), the word drivers 50 through 5n or dummy word driver 7 are controlled to bias the word lines WL0 through WLn or dummy word line DWL to a positive voltage. In this case, word drivers 50 through 5n are controlled simultaneously or by being selected by an address signal (not shown) or the like. In the dummy memory cells during an erasing sequence, soft-programming or programming is executed prior to soft-programming to the memory cells. Therefore, prior to a program control signal SSP, a program control signal SDSP is outputted.

In an erasing operation executed prior to a program operation or the like by an erasing control signal SER outputted from a control section (not shown), the word drivers 50 through 5n are simultaneously controlled, whereby the word lines WL0 through WLn to which memory cells arranged in the memory cell array 1 have been connected are biased to a negative voltage. At this time, the dummy driver 7 is not controlled by the erasing control signal SER and the dummy word line DWL connected to dummy memory cells is maintained at a floating state.

When an erasing operation is executed to the memory cells, the erasing operation is not executed to the dummy memory cells. Therefore, the dummy memory cells are never brought into an over-erased state. Thus, when executing a program operation or the like to the dummy memory cell after an erasing operation in an erasing sequence, the time for the no such inconvenience that the program operation or the like is not completed or it takes a great deal of time is caused.

The bit lines BL0 through BLn are examples of data input/output terminals, and the word lines WL0 through WLn are examples of control terminals. In addition, the reference cell RFDC is an example of a dedicated reference section for setting a program verify voltage for dummy memory cells, and an erasing bias control section is composed of the word drivers 50 through 5n, dummy word driver 7, and control signal SER outputted from the control section (not shown).

Figure 2:
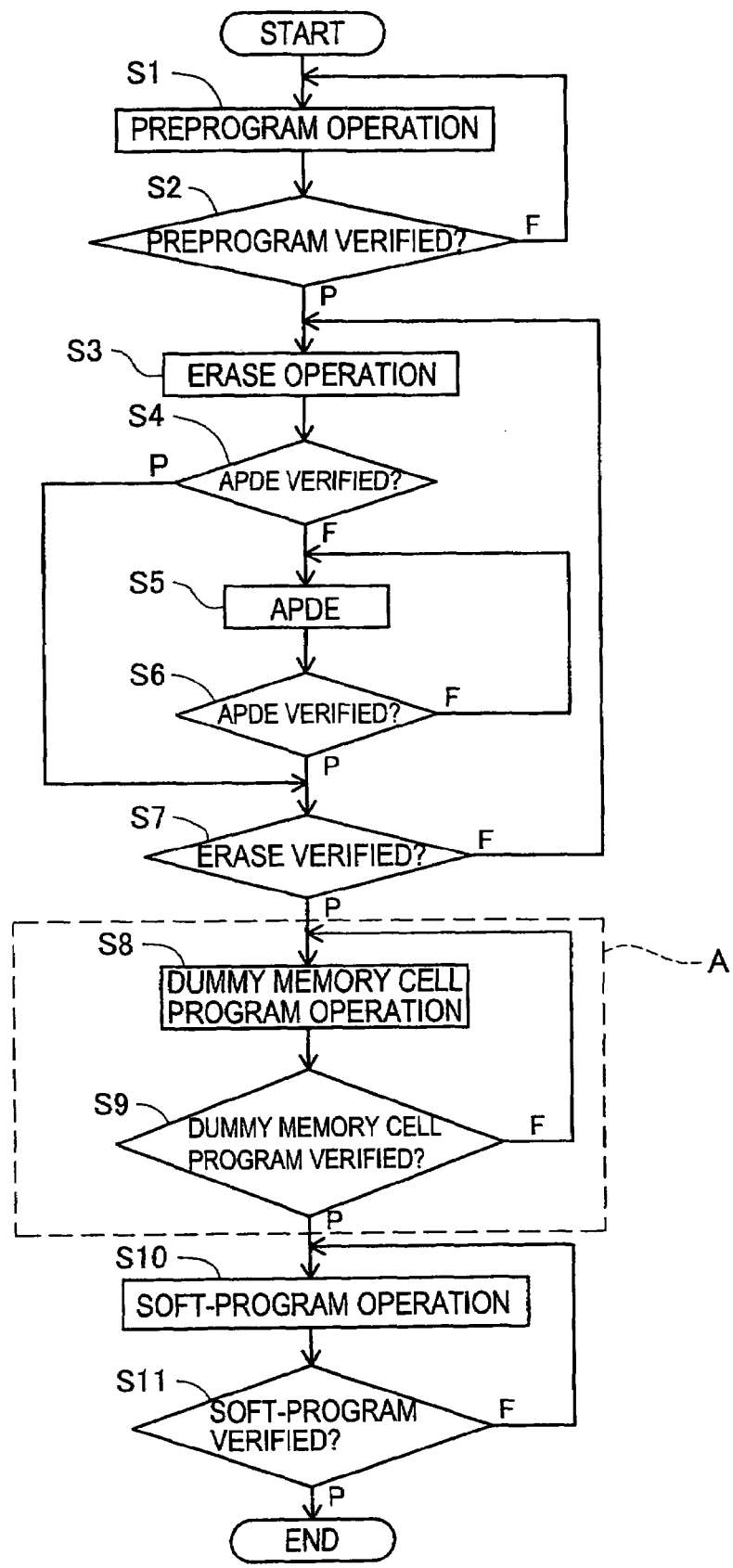
FIG. 2 is a flowchart showing an erasingسequence in accordance with the first embodiment of the present invention.

In FIG. 2, a flowchart of an erasing sequence is shown. When an erasing sequence is started, a preprogram operation is executed (S1). Step S1 is repeatedly executed until it's confirmed by preprogram verify operation (S2) that the memory cell state is shifted to a preprogrammed state. In this manner, prior to executing an erasing operation to a memory cell group wherein an erased state and an unerased state are mixed, all memory cells are brought into an unerased state. Thus, a bias application can be executed in common for all memory cells in a subsequent erasing operation to execute an erasing operation in bulk.

After completion of preprogramming (S1, S2), an erasing operation is executed (S3). Thereafter, an APDE verify operation is executed (S4), and if the verify operation does not pass (S4: F), an APDE operation is executed (S5). Here, APDE is a means for recovering a negative threshold value of an over-erased memory cell to a positive threshold value wherein a bias is evenly applied to respective drains of all memory cells via bit lines and, based on a drain-disturb phenomenon and particularly for memory cells in an over-erased state, relief of the over-erased state is realized. A voltage is simultaneously applied to respective drain terminals of a plurality of memory cells which share a bit line. In addition, there also exists an APDE means which is executed via a bit line to respective drains of a plurality of memory cells connected to a specific bit line. In either case, by having the respective word lines in the vicinity of approximately 0v and applying a positive bias to the bit line, over-erased memory cells with a higher floating gate potential (namely, a lower threshold value) receive more influence of drain disturbance and the potential of the floating gate is lowered (namely, the threshold value is raised), thereby relieving the over-erased state. The difference between the APDE means for relieving an over-erased state and soft-program means is that the APDE means operates with a number of memory cells via at least one bit line or more, whereas the soft-program means only operates on focused memory cells. Although the APDE means has high-speed processing performance, its threshold-value correcting amount is small.

On the other hand, soft-programming is characterized in not having high-speed performance despite a large threshold value correcting ability.

As a result of passing erase verify operation (S4: P, S7: P), all memory cells are brought into an erased state, or by an ADPE operation (S5) and ADPE verify operation (S6) as a verifying operation thereof, it is confirmed (S6: P, S7: P) that, for all memory cells, an over-erased state has been relieved by the APDE operation. Even in this condition, the over-erased state may remain in some individual memory cells. Thus, it is necessary, for each memory cell in an over-erased state, to eliminate the over-erased state by a soft-program operation (S10).

A large number of memory cells arranged in the memory cell array 1 (FIG. 1) generally have variations in their characteristics. This is because memory cells (Fast Erase Cells) which are easily shifted to an erased state by a bias application in an erasing operation and memory cells (Slow Erase Cells) which are hardly shifted to an erased state are distributed throughout the memory cell array 1. Accordingly, as a result of the erasing operation (S3), variations occur in erased states, and some memory cells are brought into an over-erased state. This variation is because the over-erased state can remain even after the APDE operation (S5) for recovering from an over-erased state.

In accordance with the first embodiment of the present invention, prior to the soft-program operation (S10), a dummy memory cell program operation (S8) is executed. The dummy memory cell program operation (S8) is continuously executed until completion of the program operation is confirmed by a dummy memory cell program verify operation (S9).

A dummy memory cell is arranged on each of the bit lines to which a plurality of memory cells are connected and, when applying a program operation to these dummy memory cells, a bias for programming is applied to the bit lines. Owing to biasing via the bit lines, a drain-disturb phenomenon occurs in memory cells in an over-erased state and a voltage stress similar to that in a program operation is applied. Thereby, the over-erased state can be reduced to lower current leakage caused by the over-erased state. After reducing the over-erased state of such memory cells by a program-like operation to the dummy memory cells according to the erased state of each memory cell, a soft-program operation (S10) and a soft-program verify operation (S11) as a verifying step thereof are executed.

Thus, voltage conditions of a program operation to the dummy memory cells may be the same as the voltage conditions of a soft-program operation and, preferably, the bias voltage to be given to the bit lines may be higher than that of soft-program conditions in order to increase drain disturbance to over-erased-memory cells.

As a result of execution of step A composed of the dummy memory cell program (S8) and dummy memory cell program verify operation (S9) as a verifying step for this program operation (S8) prior to a soft-program operation, erroneous recognition in soft-program verify operation (S11) owing to memory cells in an over-erased condition can be suppressed and excessive soft-programming can be avoided to effectively execute soft-programming.

Figure 3:
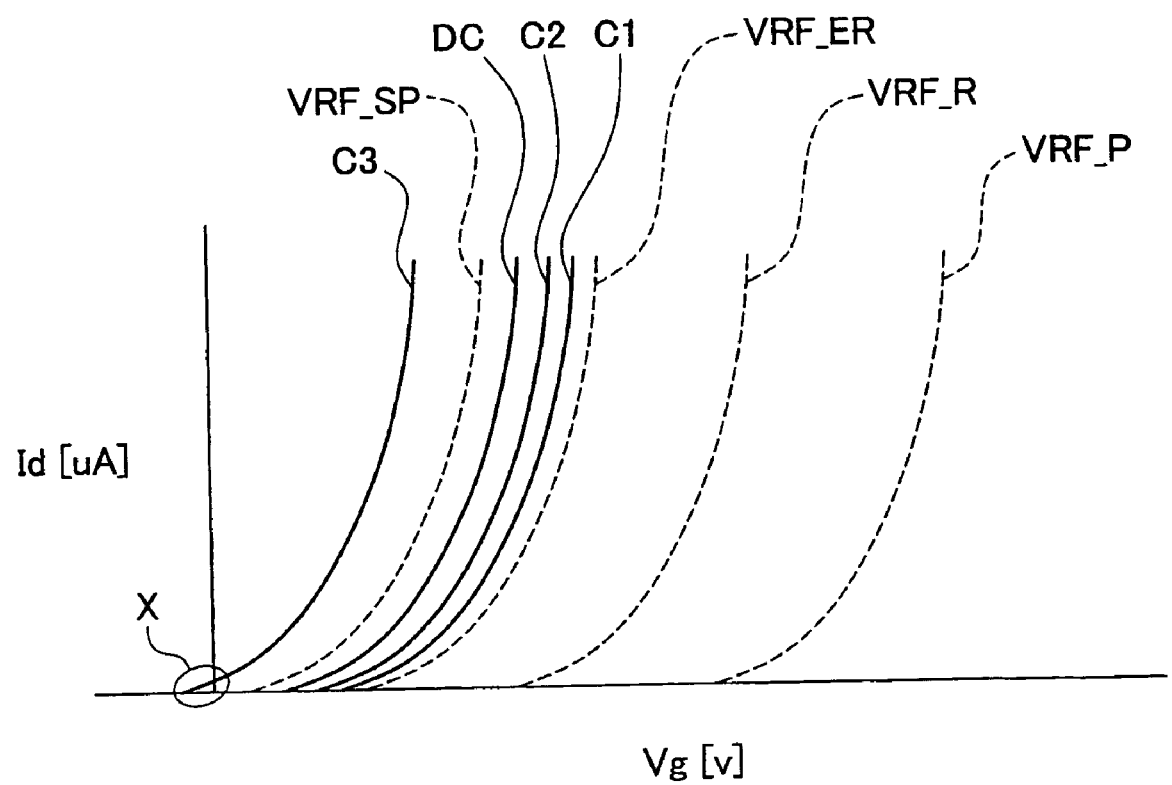
FIG. 3 is a diagram showing variation in Id-Vg characteristics of memory cells after an erasing operation.

In FIG. 3, an Id-Vg characteristic diagram of memory cells C1 through C3 and a dummy memory cell DC which have passed the erase verify operation (S7) is shown. The diagram shows a graphing of drain current Id (in μA) with respect to gate voltage Vg (in V). Since all memory cells C1 through C3 and dummy memory cell DC have passed the erase verify operation (S7: P), these are distributed on the left side of a reference curve shown as a reference voltage VRF_ER for the erase verify operation. In addition, because the cells have passed the APDE verify operation (S6: P), no memory cells whose characteristics are greatly distributed to a negative gate voltage Vg and in a depression state exist. However, the memory cell C3 shows current leak characteristics such as subthreshold characteristics in a small current region X, wherein a drain current Id flows with respect to a gate voltage Vg of 0V. This is called column leak current.

Although in a conventional method a soft-program operation would have been executed to eliminate this condition, when memory cells C1 through C3 were connected to an identical bit line, a column leak current of the memory cell C3 was added, even in a verify operation to the memory cells C1 and C2 which do not have any small current region X where a current leakage occurred. In this manner, an intrinsically unnecessary soft-program may be executed in some cases. For example, as shown in the (conventional art) graph of FIG. 4, since soft-programming was repeatedly executed to a memory cell C1 which was not in an over-erased state while leaving a memory cell C3 with a column leak current as it was, the memory cell C1 is excessively programmed and its Id-Vg characteristic, in some cases, can exceed a reference curve shown as a reference voltage VRF_ER for the erase verify operation. As a result, it may approximate a reference curve shown as a reference voltage VRF_R for a read verify operation to deteriorate the readout margin of data "1" for the memory cell C1.

In contrast thereto, in accordance with the first embodiment, prior to the soft-program operation (S10), step A composed of the dummy memory cell program operation (S8) and dummy memory cell program verify operation (S9) is provided. Thereby, as shown in the (first embodiment) graph of FIG. 4, by way of a process for programming the dummy memory cell until it has an Id-Vg characteristic exceeding a reference curve shown as a reference voltage VRF_P for program verify operation, the memory cell C3 is recovered from an over-erased state and/or the over-erased state is reduced. In this condition, a soft-program operation can be executed to the respective memory cells C1 through C3 as necessary, thereby permitting execution of effective soft-programming.

The reference voltage VRF_SP curve is a reference curve which confirms the results of a soft-program operation. A soft-program operation is executed to memory cells whose Id-Vg characteristic curves are on the left side with respect to this reference curve. Completion of soft-programming is confirmed with a shift of the Id-Vg characteristic curves to the right side as a result of a soft-program operation.

Figure 5:
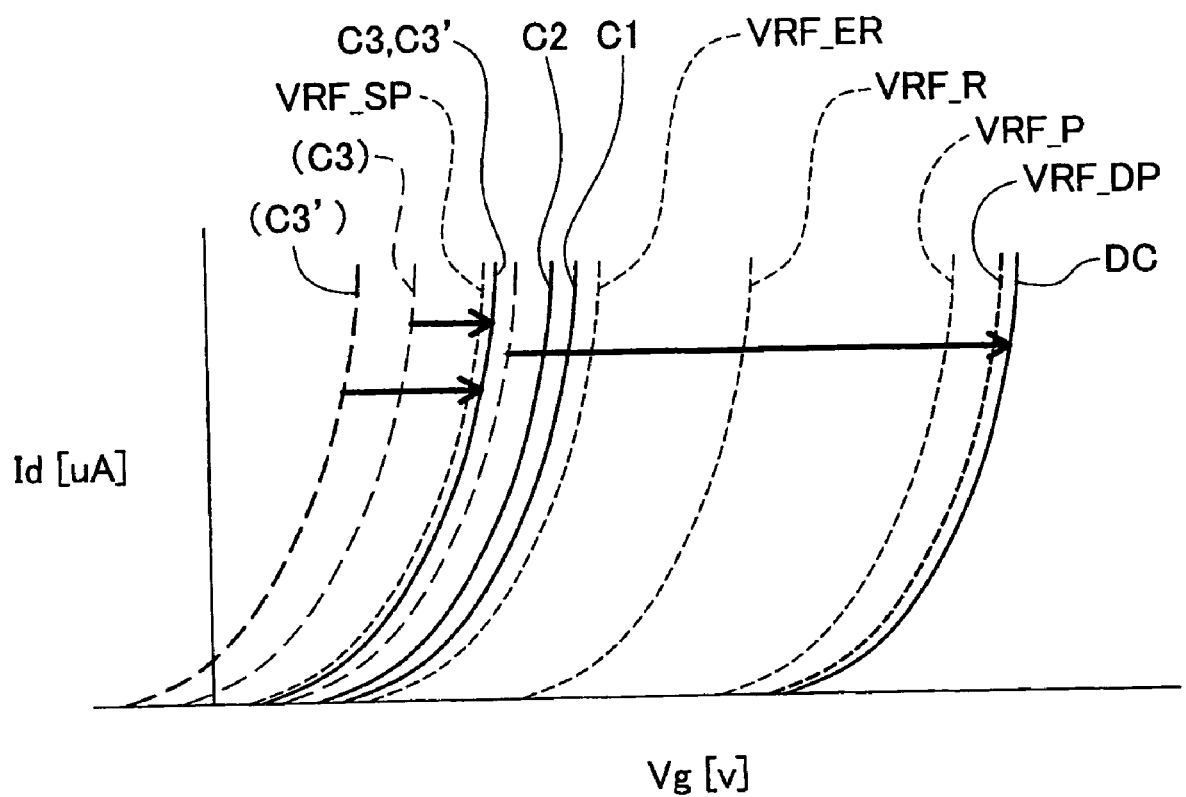
FIG. 5 is a diagram showing Id-Vg characteristics of memory cells when an erasing sequence has been completed in accordance with a first modification of the first embodiment of the present invention.

The Id-Vg characteristic graph shown in FIG. 5 shows a first modification of the first embodiment. In place of the reference voltage VRF_P for the dummy memory cell program verify operation (S9) of FIG. 3 and FIG. 4, a reference voltage VRF_DP higher in voltage than the reference voltage VRF_P is used as a dedicated reference voltage at the time of the dummy memory cell program verify operation (S9). This can be carried out by executing programming to a reference cell RFDC deeper than programming to a reference cell RFC.

Thereby, a dummy memory cell can be further deeply programmed during dummy memory cell programming prior to soft-programming by increasing the repetitive number of times of the program operation or applying a higher bias voltage to the bit lines. As a result of programming to the dummy memory cell in accordance with the foregoing, a drain-disturb phenomena to memory cells in an over-erased state can be more securely executed, thereby more securely recovering or reducing the over-erased state thereof. In addition, if a sufficient bias application is executed, the APDE operation becomes unnecessary in some cases, and a further reduction in time of the erasing sequence becomes possible.

Figure 6:
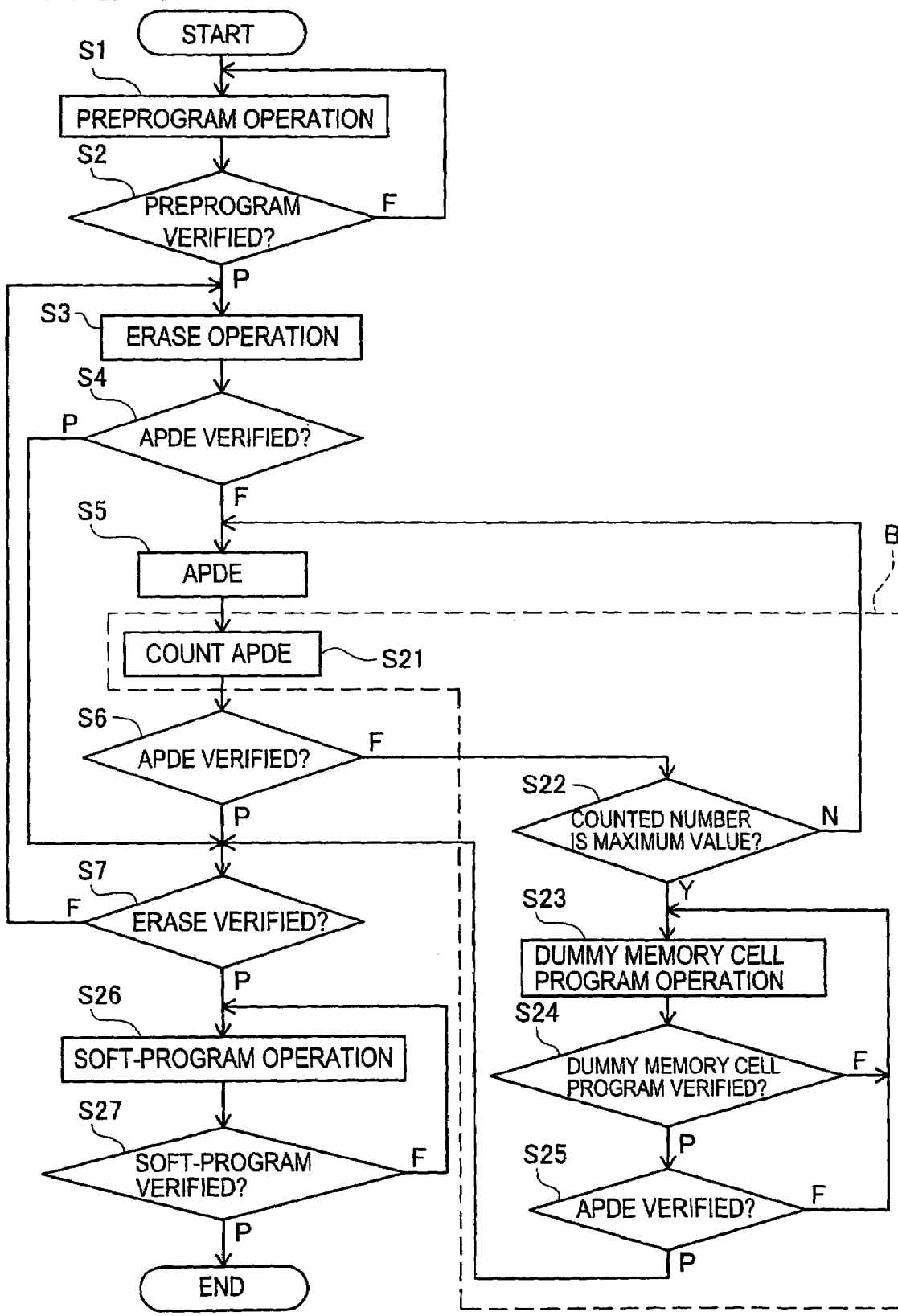
FIG. 6 is a flowchart showing an erasing sequence in accordance with a second modification of the first embodiment of the present invention.

In the flowchart of FIG. 6, a second modification of the first embodiment is shown. In place of step A in the flowchart shown in FIG. 2, step B is provided. Step B is inserted between an APDE operation (S5) and an APDE verify operation (S6) executed after the APDE operation. Step B is composed of the following respective steps. After an APDE operation (S5), the number of repetitive times of the APDE operation is counted (S21), and APDE verify operation is executed (S6). If the verify operation does not pass (S6: F), whether or not the number of repetition times of the APDE operation is a maximum value is judged (S22). If the number has not reached the maximum value (S22: N) for repeating the APDE operation, the process returns to step S5, and the APDE operation is again executed (S5). If it has reached the maximum value (S22: Y), a dummy memory cell program operation is executed (S23). The dummy memory cell programming is repeated until dummy memory cell program verify operation passes (S24: F), and based on passing (S24: P), an APDE verify operation is executed (S25). If the APDE verify operation does not pass (S25: F), the process returns to the dummy memory cell program operation (S23), and if it passes (S25: P), the process returns to the erase verify operation (S7). If the erase verify operation does not pass (S7: F), the process returns to the erasing operation (S3), and, thus, the processing is repeated. If it passes (S7: P), a soft-program operation (S26) is repeatedly executed until a soft-program verify operation (S27) passes.

In some non-volatile memories, variation in characteristics of memory cells after the erasing operation (S3) can be within a range that can be recovered or reduced by a following APDE operation (S5). In this case, by setting a number of repetitive times of the APDE operation (S5) (S22), without-executing a dummy memory cell program operation (S23) and a verify operation (S24) thereof, a memory cell erasing operation can be completed. In addition, in a case where memory cells whose recovery is slow are present in the memory cells in an over-erased state, even by repeating an APDE operation to apply bias to the whole of the memory cell array 1, recovery may be inefficiently attained. By setting a number of repetitive times of the APDE operation (S5) in advance, and by executing the dummy memory cell program operation (23) when this is exceeded, memory cells in an over-erased state can be efficiently recovered.

Figure 7:
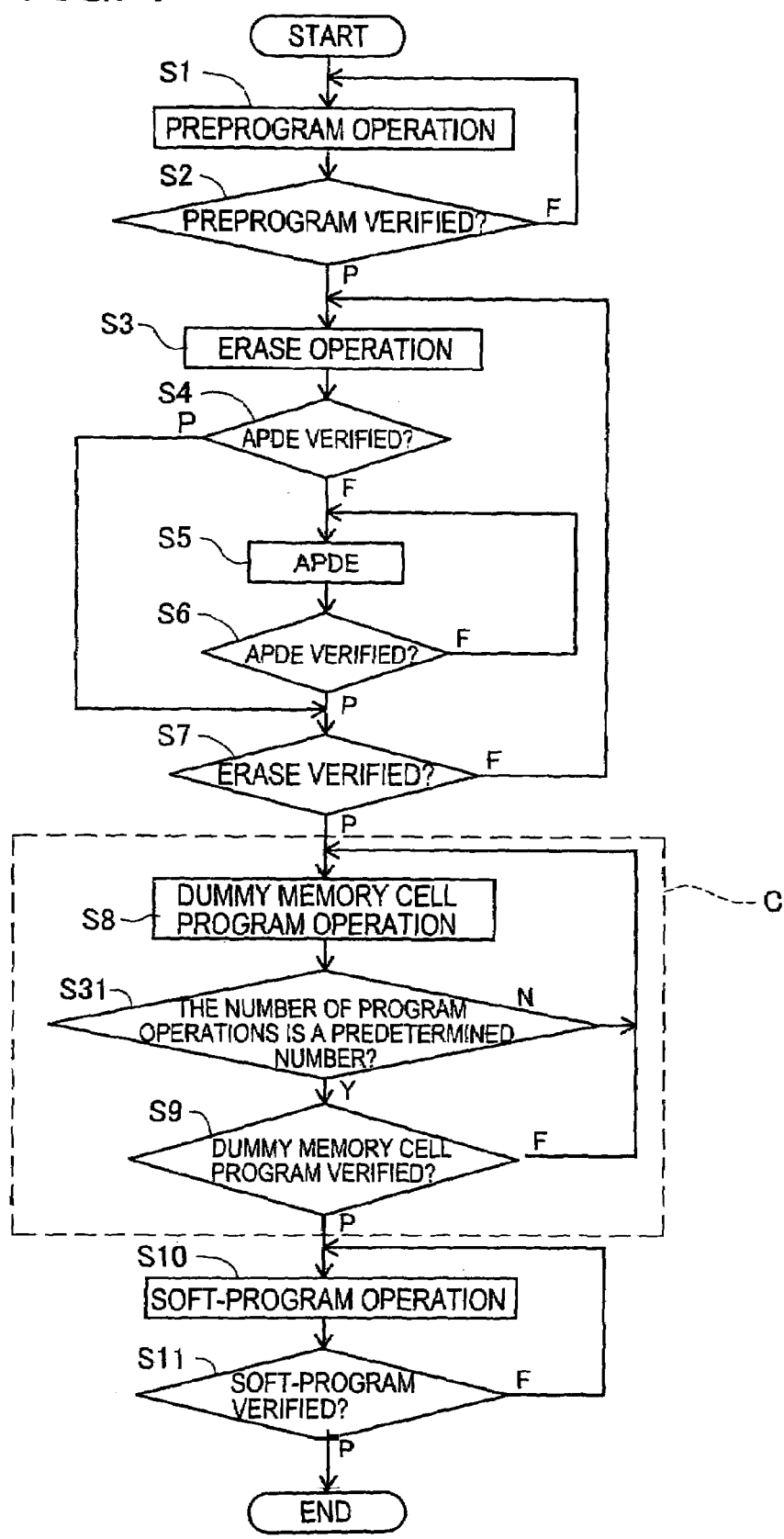
FIG. 7 is a flowchart showing an erasing sequence in accordance with a third modification of the first embodiment of the present invention.

In the flowchart of FIG. 7, a third modification of the first embodiment is shown. In place of step A in the flowchart shown in FIG. 2, step C is provided. Similar to step A, step C is inserted between the erase verify operation (S7) and the soft-program operation (S10). Step C is composed of, in addition to the dummy memory cell program operation (S8) and the dummy memory cell program verify operation (S9) of step A, a step (S31) for controlling a consecutive program number of times the dummy memory cell is programmed (S8), between the dummy memory cell program operation (S8) and the dummy memory cell program verify operation (S9).

In the flowchart of FIG. 2, the dummy memory cell program verify operation (S9) has been executed for each of the dummy memory cell program operations (S8) to confirm a dummy memory cell condition for each of the program operations to the dummy memory cell. However, in the third modification, a verify operation is executed for every predetermined number of times of program operations to the dummy memory cell. If a setting is provided so that a predetermined number of times of program operations is successively executed when a change in characteristics of a dummy memory cell is not sufficient and/or a drain-disturb phenomenon in memory cells is not sufficiently executed by a single instance of program operation to the dummy memory cell, the dummy memory cell program verify operation (S9) can be efficiently executed to confirm a programmed state of the dummy memory cell and/or a recovery state of memory cells from the over-erased state.

Figure 8:
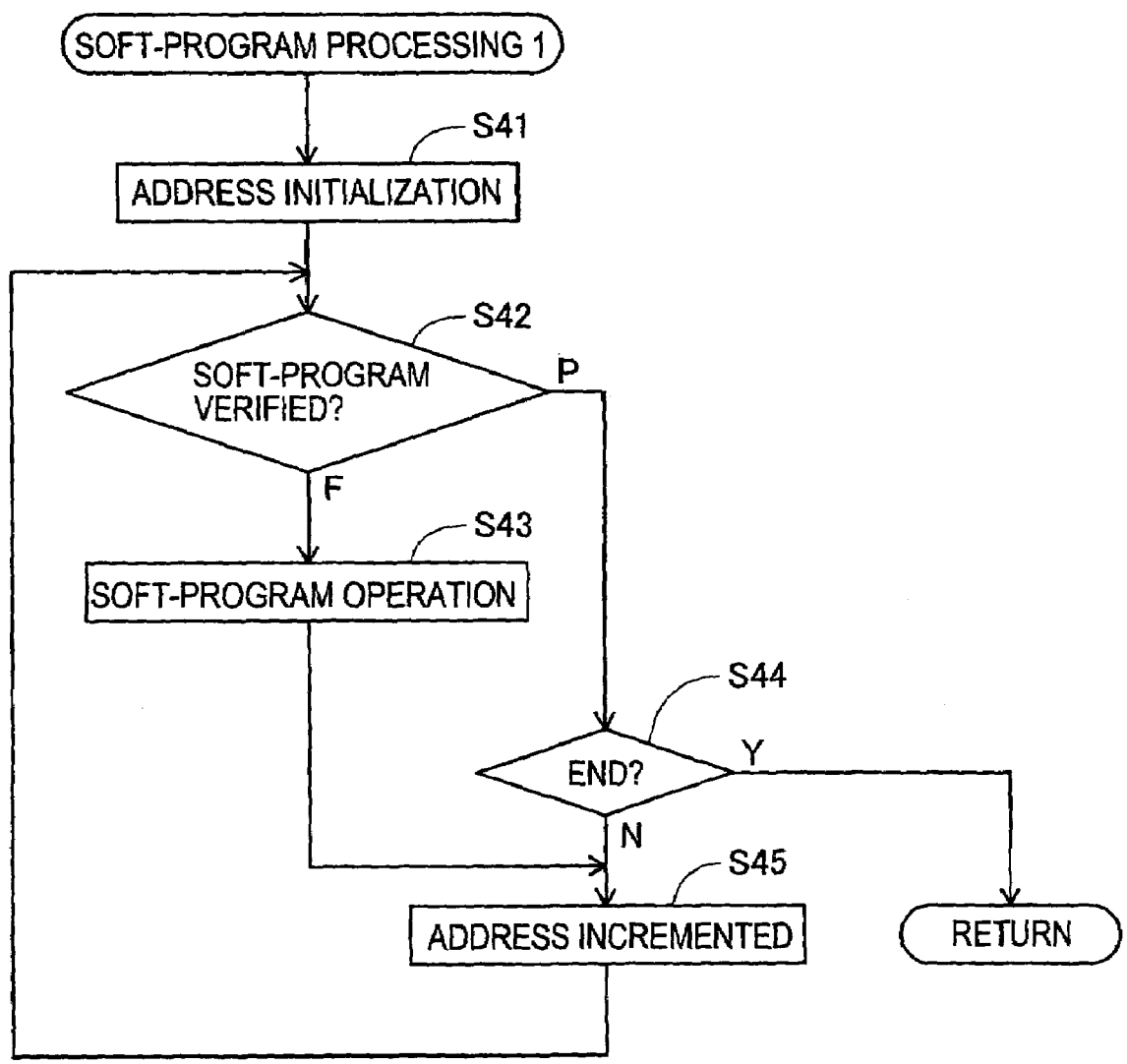
FIG. 8 is a flowchart showing a first erasing sequence in accordance with a second embodiment of the present invention.
Figure 9:
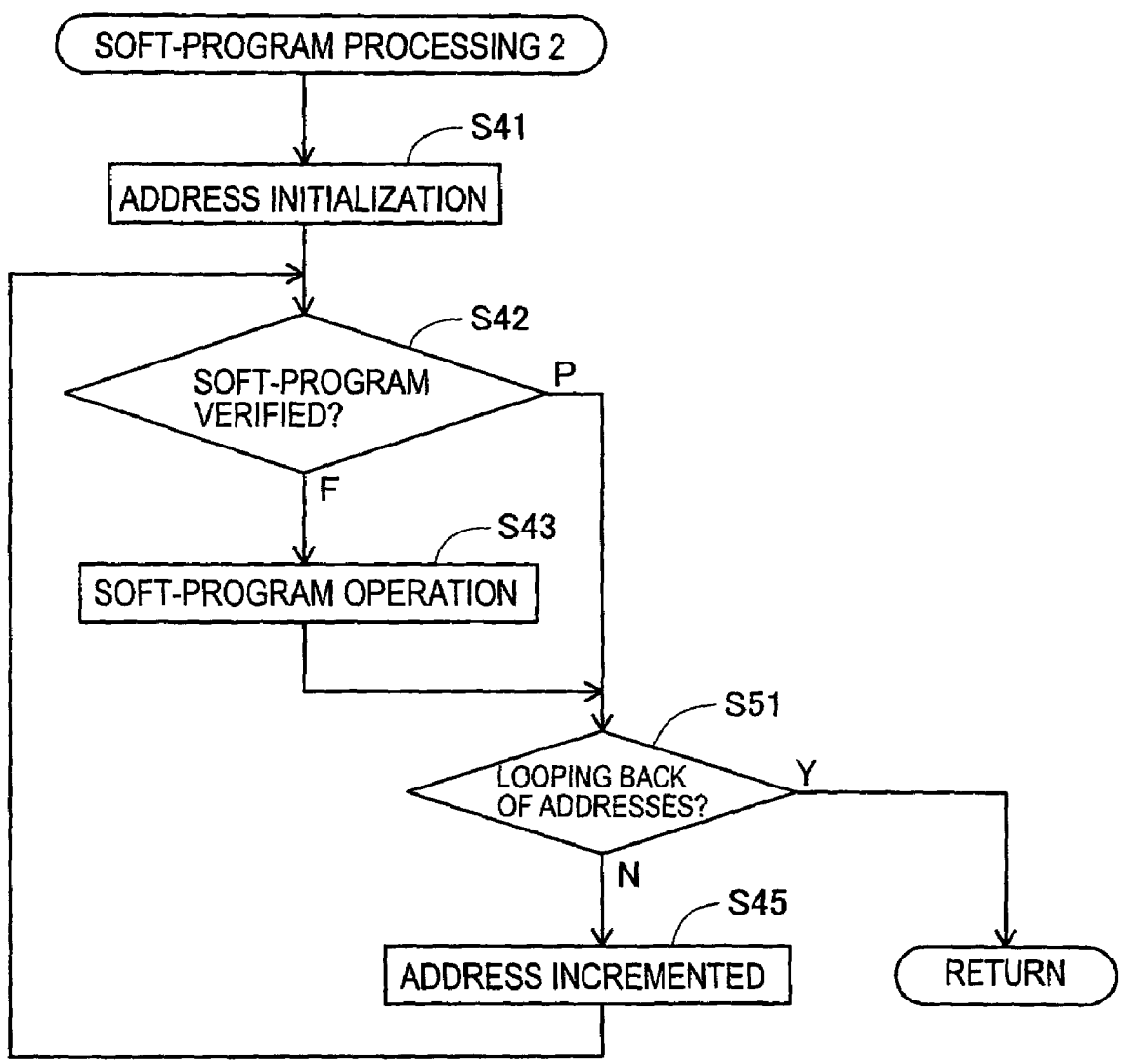
FIG. 9 is a flowchart showing a second erasing sequence in accordance with the second embodiment of the present invention.

In FIG. 8 and FIG. 9, erasing sequences in accordance with a second embodiment are shown. These are for providing erasing methods which can prevent unnecessarily successively executing a soft-program operation for a specific memory cell, even when memory cells in an over-erased state have been connected to an identical bit line, thereby preventing deterioration in a readout margin of data "1" owing to an excessive program operation without erroneously recognizing a programmed state of soft-programming target memory cells.

In FIG. 8, a first method is shown. This is a method wherein a soft-program processing is continued until all memory cells have passed a soft-program verify operation while changing memory cells to be a target in order for each soft-program operation. Hereinafter, this first method is described as Soft-Program Processing 1.

When Soft-Program Processing 1 is started, an address initialization is first executed (S41). A soft-program verify operation is then executed to a memory cell corresponding to the initialized address (S42). If the verify operation does not pass (S42: F), a soft-program operation is executed (S43), and without verifying operation as to a programmed state, the address is incremented (S45). A soft-program verify operation is executed to the memory cell newly selected by the address increment (S42). If the verify operation passes (S42: P), whether or not all memory cells selected by addresses have passed verify operation is judged (S44), and if there are memory cells which have not passed verify operation (S44: N), the address is incremented by step (S45) and the process is further repeated. In response to all memory cells having passed verify operation (S44: Y), the process is finished.

In FIG. 9, a second method is shown. This is a method wherein, while changing memory cells in order for each soft-program operation, the processing is finished when soft-programming has been executed to all memory cells by looping back the addresses. Hereinafter, this second method is described as Soft-Program Processing 2.

In Soft-Program Processing 2, similar to Soft-Program Processing 1, steps S41 through S43 and step 45 are executed. In Soft-Program Processing 2, however, in place of step S44 in Soft-Program Processing 1, step S51 is provided. Namely, in response to passing the soft-program verify operation in step S42 (S42: P), whether or not all addresses have been selected by address increment is judged. If there are unselected addresses (S51: N), the address is incremented by step S45 and the process is further repeated, and in response to all addresses having been selected by looping back in address selection (S51: Y), the process is finished.

Herein, when executing a soft-program operation (S43) again after a soft-program (S43) has been finished, a focused memory cell to be a target of soft-program operation is renewed by an incremented address (S45). Namely, a focused memory cell to be a target of soft-program operation in the next soft-program operation (S43) is a non-focused memory cell in the current soft-program operation (S43).

Figure 10:
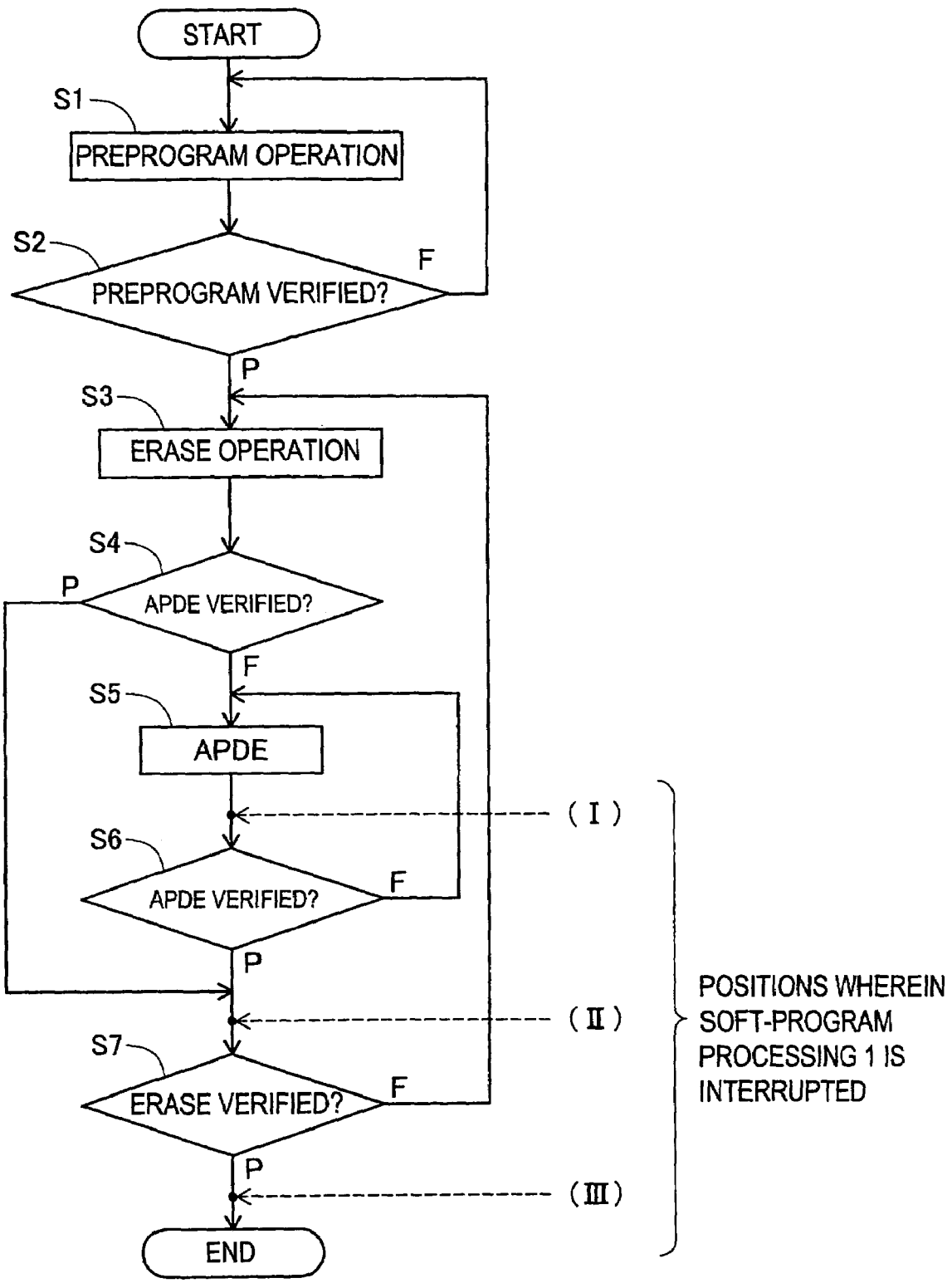
FIG. 10 is a flowchart showing a first specific example in accordance with the second embodiment of the present invention.
Figure 11:
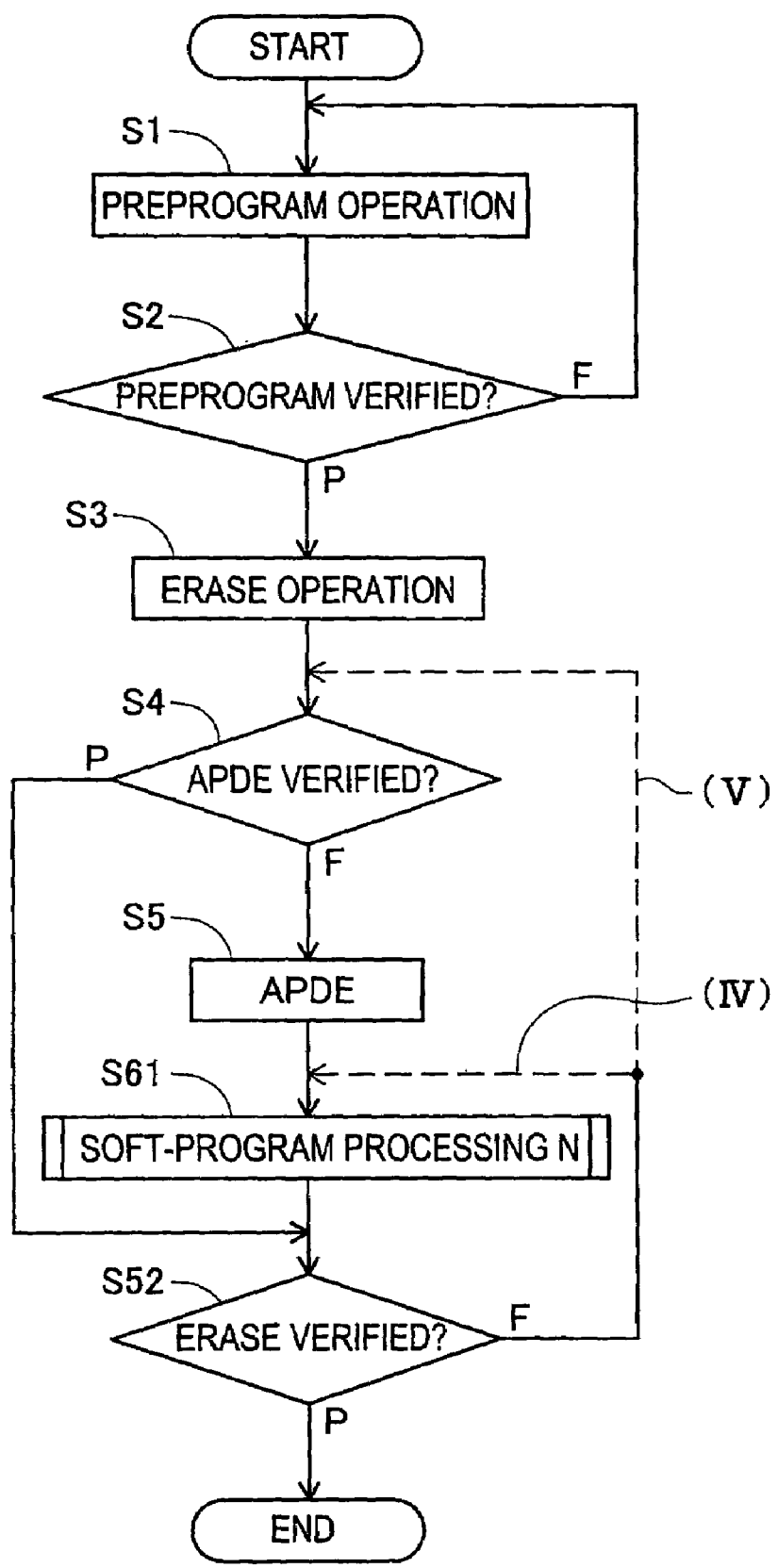
FIG. 11 is a flowchart showing a second specific example in accordance with the second embodiment of the present invention.
Figure 12:
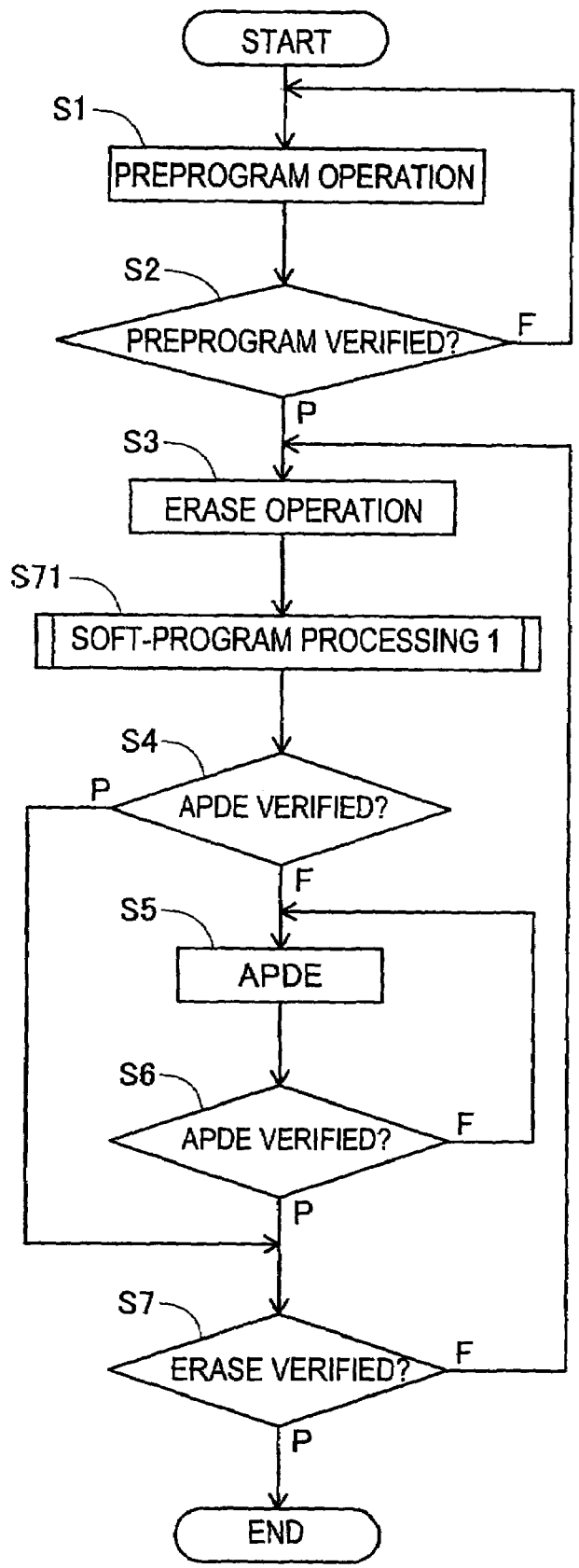
FIG. 12 is a flowchart showing a third specific example (1) in accordance with the second embodiment of the present invention.
Figure 13:
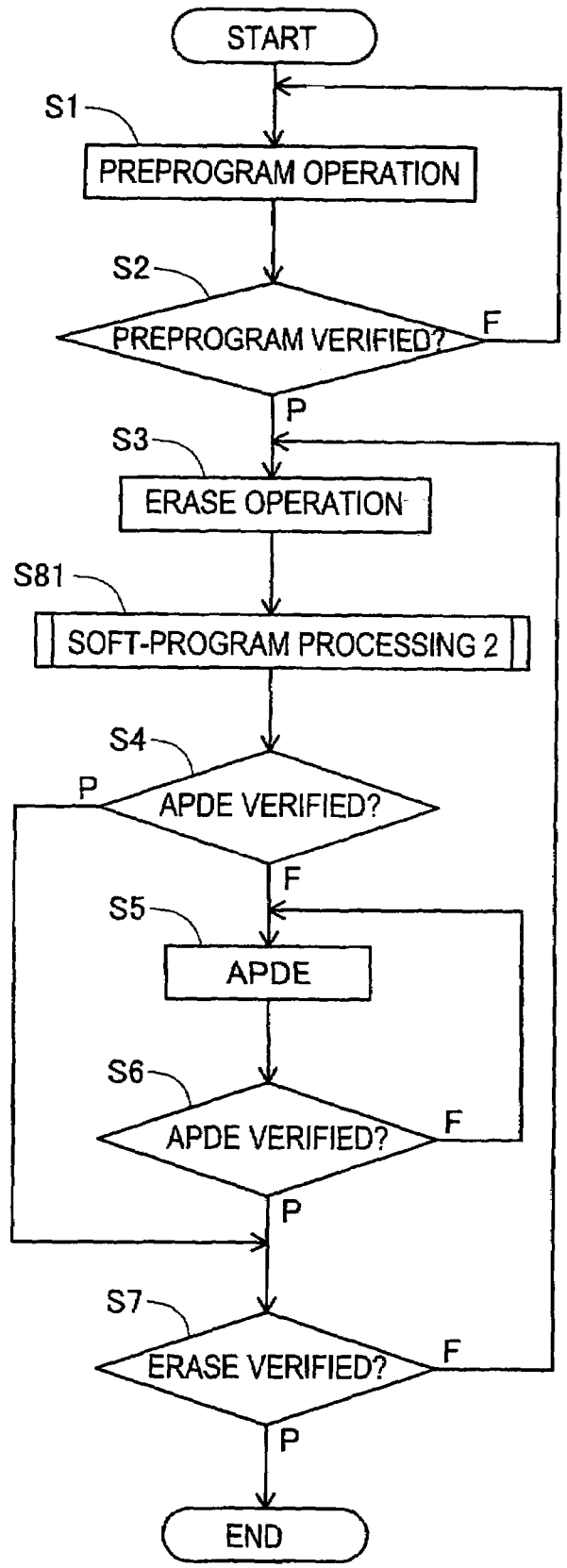
FIG. 13 is a flowchart showing a third specific example (2) in accordance with the second embodiment of the present invention.
Figure 14:
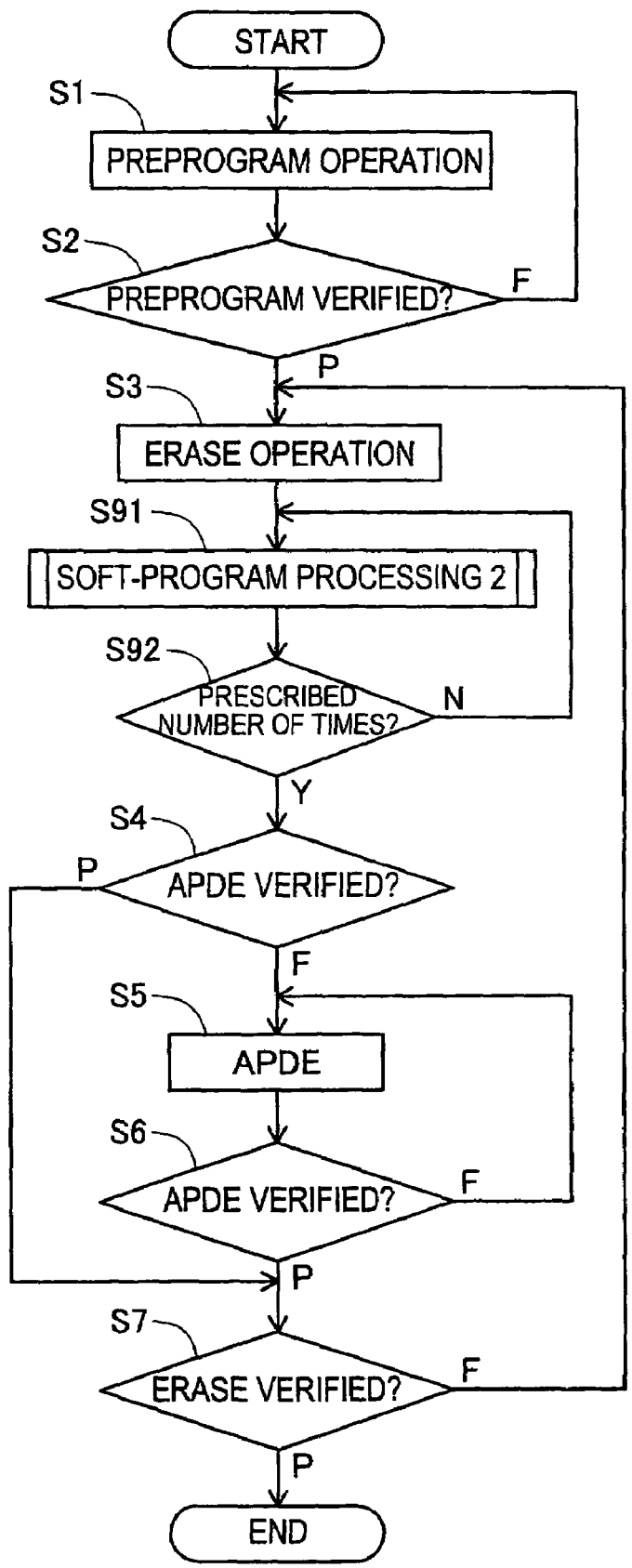
FIG. 14 is a flowchart showing a third specific example (3) in accordance with the second embodiment of the present invention.

In FIGS. 10 through 14, flowcharts of erasing sequences with specific examples according to the inserting position of Soft-Program Processing and/or a distinction between Soft-Program Processings (distinction between Soft-Program Processings 1 and 2) are shown. FIG. 10 shows a first specific example, FIG. 11 is a second specific example, and FIG. 12 through FIG. 14 show third specific examples.

The first specific example of FIG. 10 is a flowchart showing, in a flowchart of an erasing sequence of steps S1 through S7, specific examples of the inserting position of Soft-Program Processing 1. Soft-Program Processing 1 wherein a soft-program operation is completed can be appropriately inserted in a successive erasing sequence. A case of insertion, after a preprogram operation (S1) and a verify operation (S2) thereof, and after executing an erasing operation (S3) and an APDE operation (S5) (FIG. 10, position (I)); or a case of insertion after executing an APDE verify operation (S6) after an APDE operation (S5) (FIG. 10, position (II)); or a case of insertion after an erase verify operation (S7) (FIG. 10, position (III)), and the like can be considered.

The second specific example of FIG. 11 is a case where, in a flowchart of an erasing sequence, Soft-Program Processing 1 or 2 is inserted (S61) after an APDE operation (S5). No APDE verify operation is provided after the APDE operation (S5), and, in place of the APDE verify operation, a soft-program verify operation executed in Soft-Program Processing 1 or 2 (S61) is substituted. In addition, when erase verify operation (S52) is executed after Soft-Program Processing 1 or 2, and if the erase verify operation does not pass, the Soft-Program Processing 1 or 2 (S61) is repeated again (FIG. 11, position (IV)) or is repeated before an APDE operation (S5) is executed after an APDE verify operation (S4) (FIG. 11, position (V)).

The third specific examples (1) through (3) of FIGS. 12 through 14 are flowcharts in cases where, in the flowcharts of erasing sequences of steps S1 through S7, Soft-Program Processing 1 or 2 is inserted between an erasing operation (S3) and an APDE verify operation (S4).

The third specific example (1) shown in FIG. 12 is a case of insertion of Soft-Program Processing 1 (S71). In this case, after the erasing operation (S3), a soft-program operation is completed prior to the APDE verify operation (S4).

The third specific example (2) shown in FIG. 13 is a case of insertion of Soft-Program Processing 2 (S81). In this case, after the erasing operation (S3), a soft-program operation is once executed for all memory cells prior to the APDE verify operation (S4).

The third specific example (3) shown in FIG. 14 is a case where, for Soft-Program Processing 2 (S91), a step (S92) for judging a prescribed number of times is provided, and the Soft-Program Processing 2 (S91) is repeated the prescribed number of times. In this case, after the erasing operation (S3), a soft-program operation (S91) is executed the prescribed number of times (S92) to all memory cells prior to the APDE verify operation (S4).

Figure 15:
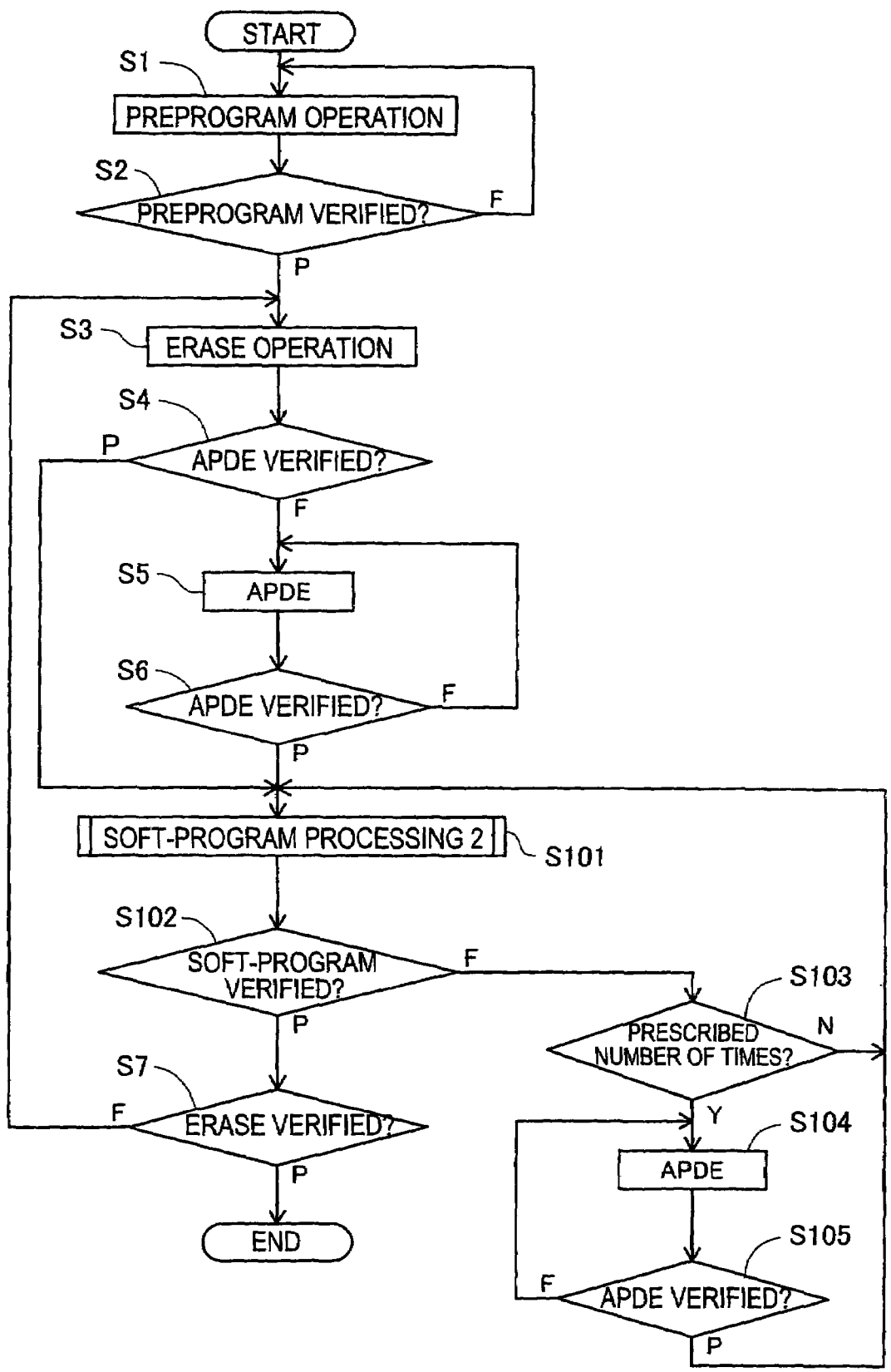
FIG. 15 is a flowchart showing a fourth specific example in accordance with the second embodiment of the present invention.

A fourth specific example shown FIG. 15 is a flowchart in a case where, in a flowchart of an erasing sequence of steps S1 through S7, Soft-Program Processing 2 is executed not more than a prescribed number of times to all memory cells, and also, when the Soft-Program Processing 2 is performed more than the prescribed number of times, an APDE operation is executed.

When an APDE verify operation which is executed after an APDE operation (S5) passes (S6: P), the Soft-Program Processing 2 is executed (S101). If a soft-program verify operation subsequent thereto does not pass (S102: F), a number of processing times of the Soft-Program Processing 2 (S101) which executes soft-programming once for all memory cells is judged (S103). If it is below a prescribed number of times (S103: N), the process again returns to the Soft-Program Processing 2 (S101). If it has reached a prescribed number of times (S103: Y), an APDE operation (S104) is executed, and this is repeated until an APDE verify operation (S105) passes (S105: P). When the verify operation passes, the process again returns to the Soft-Program Processing 2 (S101). When the soft-program verify operation passes (S102: P) with respect to the Soft-Programming Processing 2 (S101), the process shifts to an erase verify operation (S7).

As is apparent from the above description, according to the present embodiment, by executing a program operation or the like to dummy memory cells, a disturbance phenomenon can be induced in memory cells in an over-erased state connected in common to the bit lines BL0 through BLn. Thereby, a pseudo-program operation can be executed to the memory cells in an over-erased state to realize a recovery from the over-erased state or an elimination of the over-erased state.

In addition, in the case where memory cells in a normal erased state and memory cells in an over-erased state are connected in common to the bit lines BL0 through BLn, since a program operation or the like is never successively executed to identical memory cells, an excessive program operation or the like is never executed to memory cells in a normal state by a program operation or the like based on an erroneous judgement. Thus, operation in accordance with the present invention can avoid a situation where, for memory cells in a normal state, the readout margin of data "1" is deteriorated or a situation wherein completion of a program operation or the like cannot be detected since a large number of memory cells in an over-erased state are connected.

An erasing operation can be executed to a plurality of memory cells in bulk and, in comparison with a case where an erase pulse application is executed to each of the word lines in order, the erasing sequence in accordance with the present invention can be completed in a short time. Here, by a bulk erasing operation, effects on this invention are produced if pluralities of word lines are provided.

In addition, as a matter of course, the present invention is not limited to the above-described embodiments, and various improvements and modifications can be made without departing from the gist of the present invention.

For example, the APDE operation and soft-program operation are both examples of bias application methods for realizing recovery from an over-erased state and, as a matter of course, the order of application between both is not limited to that of the above-described embodiments. Furthermore, the number of times of application and applying conditions can also be changed. In addition, it is also possible to omit an APDE operation if a soft-program operation is provided.

In addition, the reference cells RFC and RFDC may be a memory cell structure or may not be a memory cell structure.

Also, the reference cells RFC and RFDC may be arranged in a memory cell array and connected to a differential amplifier, or the reference cells RFC and RFDC may be connected to a differential amplifier via a bit line or a reference bit line.

Thus, although the method of the writing operation as programming or soft-programming has been described by a hot-electron injection method, this may also be a Fowler-Nordheim tunneling method. Furthermore, although memory cells with a floating gate structure have been described, and these may be memory cells with an ONO structure or the like.

What is claimed is:

1. A data erase method for a non-volatile memory device to which a plurality of electrically rewritable memory cells are connected by a predetermined number of data input/output terminals wherein the non-volatile memory device includes a plurality of dummy memory cells which share the data input/output terminals with the plurality of memory cells, the data erase method comprising the steps of:

executing an erase operation on the plurality of memory cells;

applying a bias voltage to the data input/output terminals by executing the program operation on the plurality of dummy memory cells; and applying a bias voltage related to a program operation to the data input/output terminals without executing a program operation on any one of the plurality of memory cells successively after the erase operation.

2. The data erase method according to claim 1 wherein the step of applying a bias voltage related to a program operation on the plurality of memory cells comprises the step of executing a program verify voltage set for the plurality of memory cells, and wherein the step of executing the program operation on the plurality of dummy memory cells comprises the step of executing a program verify voltage set for the plurality of dummy memory cells that is different from the program verify voltage set for the plurality of memory cells.

3. The data erase method according to claim 2 wherein the step of executing a program verify voltage set for the plurality of dummy memory cells comprises the step of setting a voltage level of a program verify voltage for the dummy memory cells at a voltage level higher than the program verify voltage set for the plurality of memory cells.

4. The data erase method according to claim 1 wherein the step of applying a bias voltage related to a program operation on the plurality of memory cells comprises the step of executing a soft-program voltage set for the plurality of memory cells, and wherein the step of executing the program operation on the plurality of dummy memory cells comprises the step of executing a program voltage set for the plurality of dummy memory cells that is different from the soft-program voltage set for the plurality of memory cells.

5. The data erase method according to claim 4, wherein the step of executing a program verify voltage set for the plurality of dummy memory cells comprises the step of setting a voltage level of a program voltage for the plurality of dummy memory cells at a voltage level higher than the soft-program voltage set for the plurality of memory cells.

6. The data erase method according to claim 1 wherein the step of executing the erase operation comprises the step of maintaining the plurality of dummy memory cells in a non-erase state while executing the erase operation on the plurality of memory cells.

7. The data erase method according to claim 6 wherein the step of executing the erase operation comprises the step of maintaining control terminals of the plurality of dummy memory cells in a floating state.

8. The data erase method according to claim 7, wherein the control terminals are gate terminals of the dummy memory cells.

9. The data erase method according to claim 1 further comprising after the step of executing the erase operation, the step of executing an APDE operation prior to the step of executing the program operation on the plurality of dummy memory cells.

10. The data erase method according to claim 9 wherein the step of executing the program operation on the plurality of dummy memory cells comprises the step of executing the program operation on the plurality of dummy memory cells in response to a predetermined number of times of executing the APDE operation.

11. The data erase method according to claim 1, wherein the step of applying the bias voltage related to the program operation to the data input/output terminals without executing a program operation on any one of the plurality of memory cells successively after the erase operation comprises the steps of:
   repeatedly executing a program operation on one of the plurality of memory cells; and
   executing the program operation to other ones of the plurality of memory cells thereafter.

12. The data erase method according to claim 11, wherein the program operation is a soft-program operation, and wherein the step of applying bias voltage further comprises the steps of:
   executing a soft-program verify operation on each of the plurality of memory cells; and
   depending on a result of the soft-program verify operation for each of the plurality of memory cells, executing a soft-program operation on such one of the plurality of memory cells.

13. The data erase method according to claim 12 wherein the step of executing the soft-program operation is executed after a step of executing an APDE operation.

14. The data erase method according to claim 13 wherein the step of executing a soft-program verify operation comprises the step of executing a soft-program verify operation on a result of the APDE operation together with a result of the soft-program operation.

15. The data erase method according to claim 12 wherein the step of executing the soft-program operation is executed prior to a step of executing an APDE operation.

16. The data erase method according to claim 15, wherein the step of executing the APDE operation comprises the step of executing the APDE operation in response to a predetermined number of times of executing the soft-program operation.

17. The data erase method according to claim 1 wherein the data input/output terminals are drain terminals of the memory cells and constitute bit lines.

18. The data erase method according to claim 1, wherein the data input/output terminals are drain terminals of the dummy memory cells and connected to bit lines.

* * * * *